United States Patent
Hashiguchi

(10) Patent No.: US 12,327,943 B2
(45) Date of Patent: Jun. 10, 2025

(54) SOCKET CONNECTOR INCLUDING HOUSING, CONTACTS, COVER MEMBER AND PROJECTING PART

(71) Applicant: Japan Aviation Electronics Industry, Ltd., Tokyo (JP)

(72) Inventor: Osamu Hashiguchi, Tokyo (JP)

(73) Assignee: Japan Aviation Electronics Industry, Ltd., Tokyo (JP)

( * ) Notice: Subject to any disclaimer, the term of this patent is extended or adjusted under 35 U.S.C. 154(b) by 394 days.

(21) Appl. No.: 17/894,364

(22) Filed: Aug. 24, 2022

(65) Prior Publication Data

US 2023/0073168 A1    Mar. 9, 2023

(30) Foreign Application Priority Data

Sep. 7, 2021    (JP) ................................. 2021-145320

(51) Int. Cl.
 *H01R 12/00*    (2006.01)
 *H01R 12/71*    (2011.01)
 (Continued)

(52) U.S. Cl.
 CPC .......... *H01R 12/716* (2013.01); *H01R 13/115* (2013.01); *H01R 13/639* (2013.01)

(58) Field of Classification Search
 CPC ................ H01R 12/716; H01R 13/115; H01R 13/2442; H01R 13/627; H01R 13/639; H05K 7/1069
 See application file for complete search history.

(56) References Cited

U.S. PATENT DOCUMENTS

| | | | | |
|---|---|---|---|---|
| 7,497,733 B1* | 3/2009 | Van der Steen | ....... | H01R 12/00 439/71 |
| 2010/0267287 A1* | 10/2010 | Ishikawa | ................ | H01R 12/73 439/700 |

(Continued)

FOREIGN PATENT DOCUMENTS

| | | |
|---|---|---|
| CN | 201072830 Y | 6/2008 |
| JP | 2000-133397 A | 5/2000 |

(Continued)

OTHER PUBLICATIONS

Office Action dated Apr. 10, 2023 in corresponding Taiwan Patent Application No. 111130136, with English Translation.

(Continued)

*Primary Examiner* — Abdullah A Riyami
*Assistant Examiner* — Thang H Nguyen
(74) *Attorney, Agent, or Firm* — Renner, Otto, Boisselle & Sklar, LLP

(57) ABSTRACT

A socket connector includes a housing that is made of insulating resin and have a peripheral wall and a bottom plate, the peripheral wall projecting upward from an edge of the bottom plate, a plurality of contacts that are held by the bottom plate, an upper cover member that is disposed above a semiconductor package accommodated in the housing, holds the semiconductor package downward and thereby brings the semiconductor package into electrical contact with the plurality of contacts, and a block and a block that project upward beyond the peripheral wall. The upper cover member has relief holes in which the block and the block is to be inserted at positions opposed to the block and the block in a vertical direction.

10 Claims, 16 Drawing Sheets

(51) Int. Cl.
*H01R 13/115* (2006.01)
*H01R 13/639* (2006.01)

(56) References Cited

U.S. PATENT DOCUMENTS

| | | | | |
|---|---|---|---|---|
| 2011/0195589 A1* | 8/2011 | Takahashi | ............ | H05K 7/1061 |
| | | | | 439/342 |
| 2014/0087592 A1* | 3/2014 | Endo | ....................... | H01R 12/91 |
| | | | | 439/628 |
| 2021/0126394 A1* | 4/2021 | Hashimoto | .......... | H05K 3/3457 |

FOREIGN PATENT DOCUMENTS

| | | | | |
|---|---|---|---|---|
| JP | 2000133397 | * | 5/2000 | ............. H01L 23/32 |
| JP | 2011165512 A | | 8/2011 | |
| TW | 313349 U | | 8/1997 | |
| TW | M250353 U | | 11/2004 | |

OTHER PUBLICATIONS

Office Action dated Feb. 4, 2025 in corresponding Japanese Patent Application No. 2021-145320, with English Translation.

* cited by examiner

SOCKET CONNECTOR INCLUDING HOUSING, CONTACTS, COVER MEMBER AND PROJECTING PART

INCORPORATION BY REFERENCE

This application is based upon and claims the benefit of priority from Japanese patent application No. 2021-145320, filed on Sep. 7, 2021, the disclosure of which is incorporated herein in its entirety by reference.

BACKGROUND

The present disclosure relates to a socket connector.

As shown in FIG. 16 of the present application, Patent Literature 1 (Japanese Unexamined Patent Application Publication No. 2011-165512) discloses a socket connector 100 for mounting an LGA (Land Grid Array) type semiconductor module on a circuit board. The socket connector 100 includes a housing 102 made of insulating resin in which a recessed part 101 that accommodates a semiconductor module is formed, and a plurality of contact parts 104 that are incorporated into a bottom face part 103 of the recessed part 101. The housing 102 has a rectangular shape when viewed from above, and four module guide columns 105 are formed at its four corners. The four module guide columns 105 exert the function of provisionally holding the semiconductor module and the function of positioning the semiconductor module with respect to the socket connector 100. According to the paragraph 0039 in Patent Literature 1, a cover for holding down a module is attached to the upper part of the socket connector 100, so that the semiconductor module is pressed into the recessed part 101 of the socket connector 100 and thereby the semiconductor module is electrically connected to the plurality of contact parts 104.

SUMMARY

The structure of Patent Literature 1, however, has room for improvement in terms of reducing the height.

One of the objects of the present disclosure is to provide a technique for achieving the height reduction of a socket connector of a type that holds down an object to be connected by a cover member even when the socket connector has a projecting part that projects upward beyond a peripheral wall.

According to an aspect of the present disclosure, there is provided a socket connector including a housing made of insulating resin having a peripheral wall and a bottom plate, the peripheral wall projecting upward from an edge of the bottom plate; a plurality of contacts held by the bottom plate; a cover member disposed above an object to be connected accommodated in the housing and configured to hold the object to be connected downward and bring the object to be connected into electrical contact with the plurality of contacts; and a projecting part projecting upward beyond the peripheral wall, wherein the cover member has a hole or a notch in which the projecting part is to be inserted at a position opposed to the projecting part in a vertical direction.

According to the present disclosure, the height reduction of a socket connector of a type that holds down an object to be connected by a cover member is achieved even when the socket connector has a projecting part that projects upward beyond a peripheral wall.

The above and other objects, features and advantages of the present disclosure will become more fully understood from the detailed description given hereinbelow and the accompanying drawings which are given by way of illustration only, and thus are not to be considered as limiting the present disclosure.

DESCRIPTION OF EMBODIMENTS

First Embodiment

Figure 1:
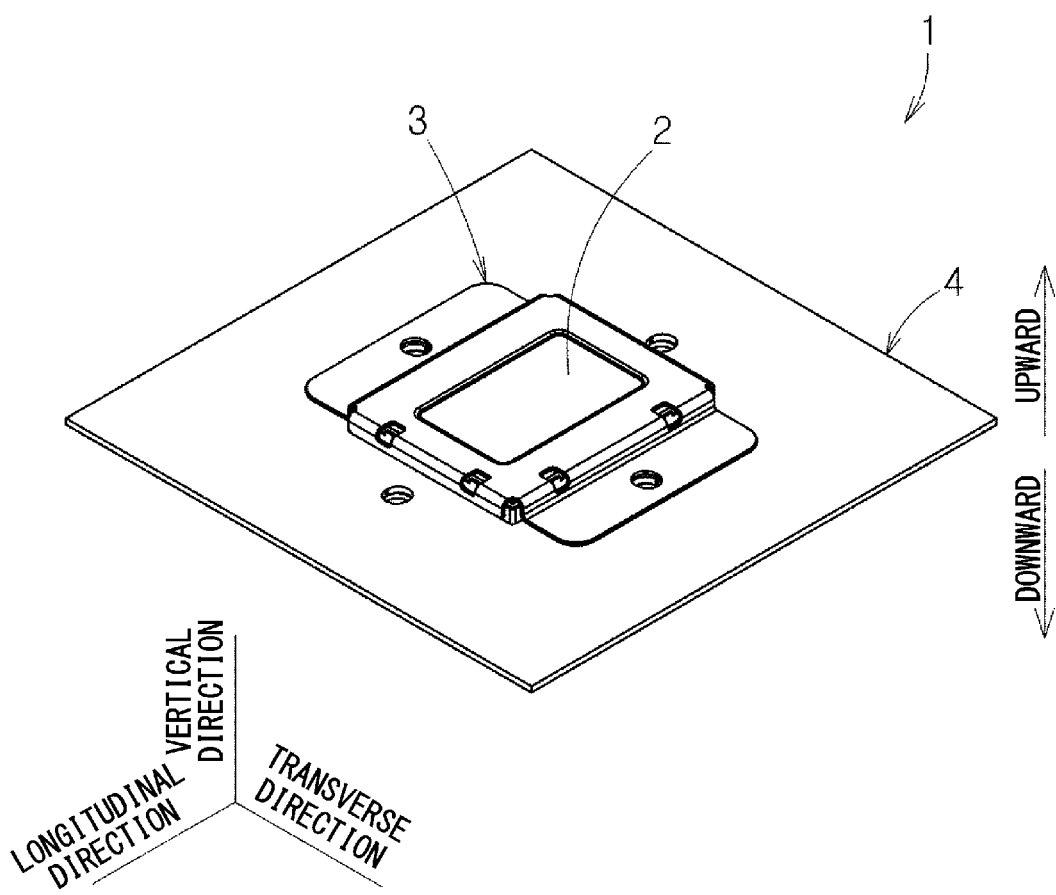
FIG. 1 is a perspective view of an information processing device (first embodiment)
Figure 2:
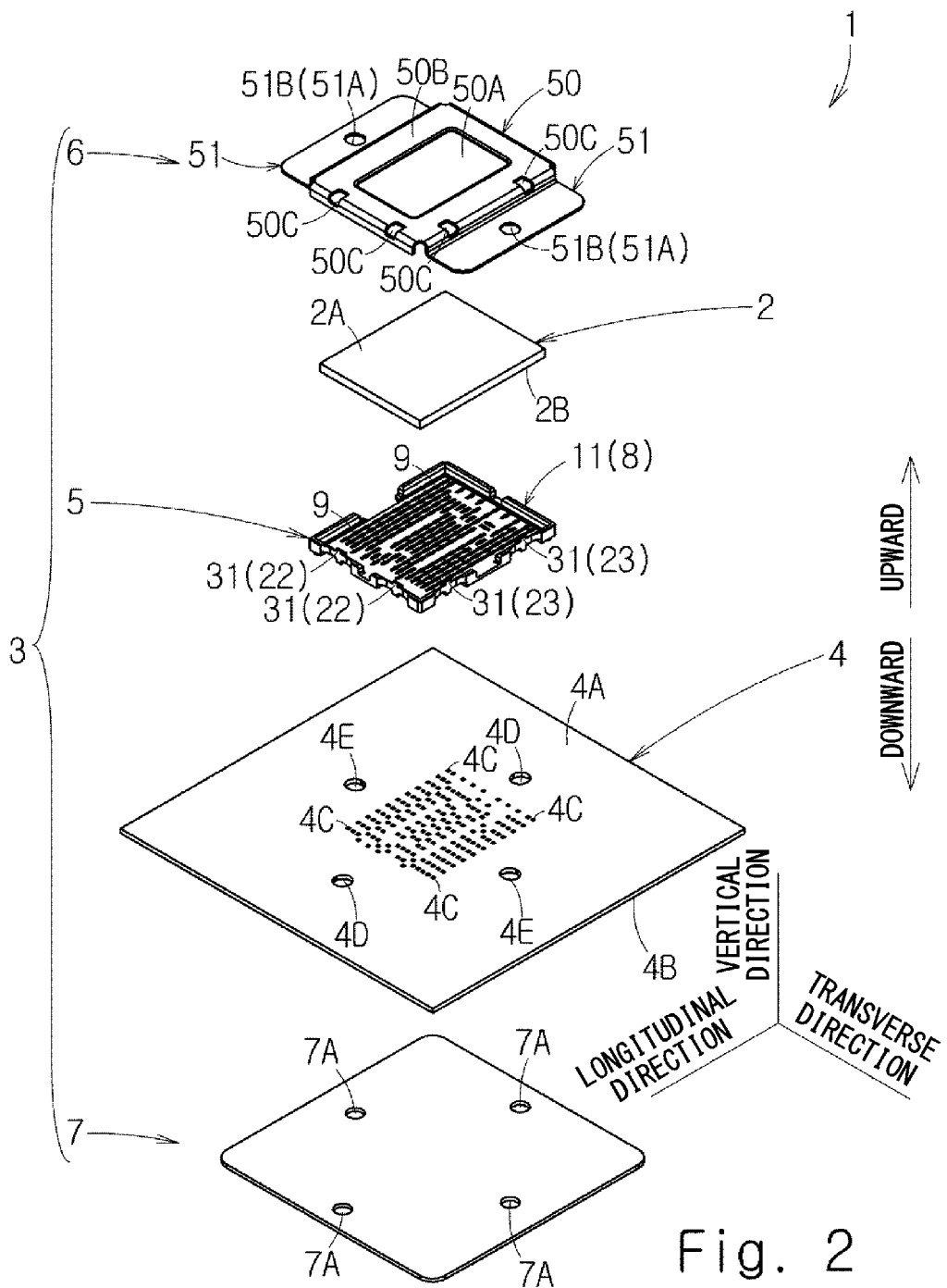
FIG. 2 is an exploded perspective view of the information processing device (first embodiment)
Figure 3:
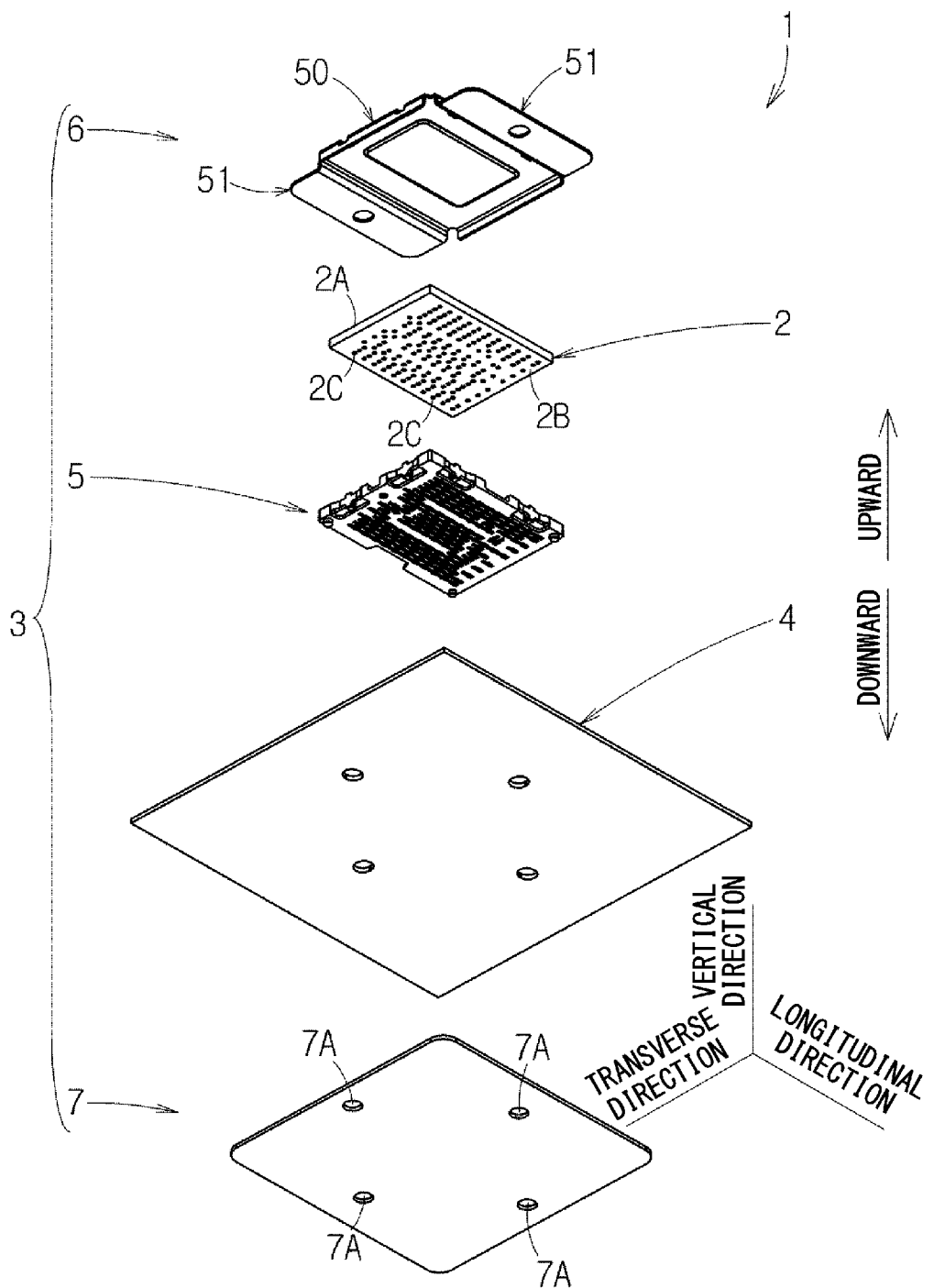
FIG. 3 is an exploded perspective view of the information processing device viewed from another angle (first embodiment)

A first embodiment of the present disclosure will be described hereinafter with reference to FIGS. 1 to 14. FIG. 1 is a perspective view of an information processing device 1. FIGS. 2 and 3 are exploded perspective views of the information processing device 1. As shown in FIGS. 1 to 3, the information processing device 1 includes a semiconductor package 2 (object to be connected), a socket connector 3, and a board 4. The socket connector 3 mechanically and electrically connects the semiconductor package 2 to the board 4.

As shown in FIGS. 2 and 3, the socket connector 3 includes a connector main body 5, an upper cover member 6 (cover member), and a lower cover member 7.

The upper cover member 6 and the lower cover member 7 are coupled to each other using bolts, which are not shown, to sandwich the semiconductor package 2, the connector main body 5, and the board 4.

The connector main body 5 has a rectangular flat plate shape when viewed from above.

The thickness direction of the connector main body 5 is defined as a vertical direction. The vertical direction includes an upward direction and a downward direction. The upward direction is the direction of viewing the connector main body 5 from the board 4. The downward direction is the direction of viewing the board 4 from the connector main body 5. The upper cover member 6, the semiconductor package 2, the connector main body 5, the board 4, and the lower cover member 7 are disposed in this recited order toward the downward direction.

Further, the connector main body 5 has a rectangular shape when viewed from above, and a direction parallel to the long side of the connector main body 5 is defined as a longitudinal direction, and a direction parallel to the short side of the connector main body 5 is defined as a transverse direction. However, when the connector main body 5 has a square shape when viewed from above, a direction parallel to any one side of the connector main body 5 may be defined as a longitudinal direction for the sake of convenience, and a direction parallel to a side adjacent to this one side may be defined as a transverse direction for the sake of convenience.

The longitudinal direction includes an inward longitudinal direction and an outward longitudinal direction. The inward longitudinal direction is a direction of getting closer to the center of the connector main body 5 in the longitudinal direction. The outward longitudinal direction is a direction of getting away from the center of the connector main body 5 in the longitudinal direction.

Likewise, the transverse direction includes an inward transverse direction and an outward transverse direction. The inward transverse direction is a direction of getting closer to the center of the connector main body 5 in the transverse direction. The outward transverse direction is a direction of getting away from the center of the connector main body 5 in the transverse direction.

Note that the vertical direction, the longitudinal direction, and the transverse direction defined as above are directions defined by way of illustration only and should not be interpreted as limiting the actual posture of the information processing device 1 and the socket connector 3.

(Semiconductor Package 2)

The semiconductor package 2 is typically of an LGA (Land Grid Array) type. Alternatively, the semiconductor package 2 may be of a BGA (Ball Grid Array) type. As shown in FIGS. 2 and 3, the semiconductor package 2 has a rectangular flat plate shape when viewed from above. The semiconductor package 2 includes an upper surface 2A and a lower surface 2B. As shown in FIG. 3, a plurality of lands 2C are formed on the lower surface 2B of the semiconductor package 2. The semiconductor package 2 is one specific example of an object to be connected. The object to be connected is not limited to the semiconductor package and may be another electronic component.

(Board 4)

Referring back to FIG. 2, the board 4 is a rigid board such as a paper phenolic board or a glass epoxy board, for example. Alternatively, the board 4 may be a flexible board. The board 4 includes an upper surface 4A and a lower surface 4B. The connector main body 5 of the socket connector 3 is mounted on the upper surface 4A typically by reflow. A plurality of lands 4C are formed on the upper surface 4A. The board 4 has two longitudinal penetrating holes 4D that are separated from each other in the longitudinal direction in such a way that the plurality of lands 4C are interposed therebetween in the longitudinal direction, and two transverse penetrating holes 4E that are separated from each other in the transverse direction in such a way that the plurality of lands 4C are interposed therebetween in the transverse direction.

(Socket Connector 3)

As shown in FIGS. 2 and 3, the socket connector 3 is composed of the connector main body 5, the upper cover member 6, and the lower cover member 7 as described earlier.

Figure 4:
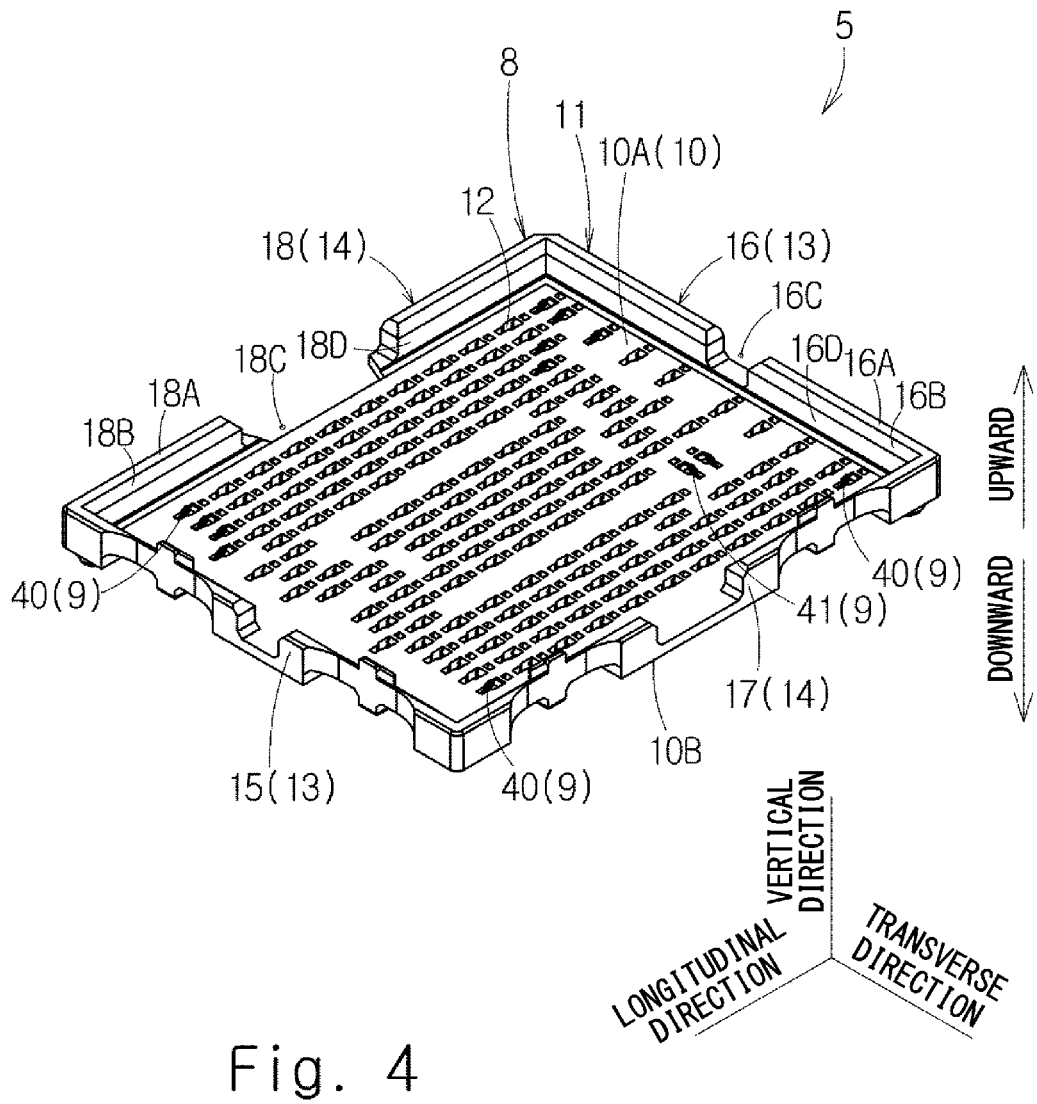
FIG. 4 is a perspective view of a connector main body (first embodiment)
Figure 5:
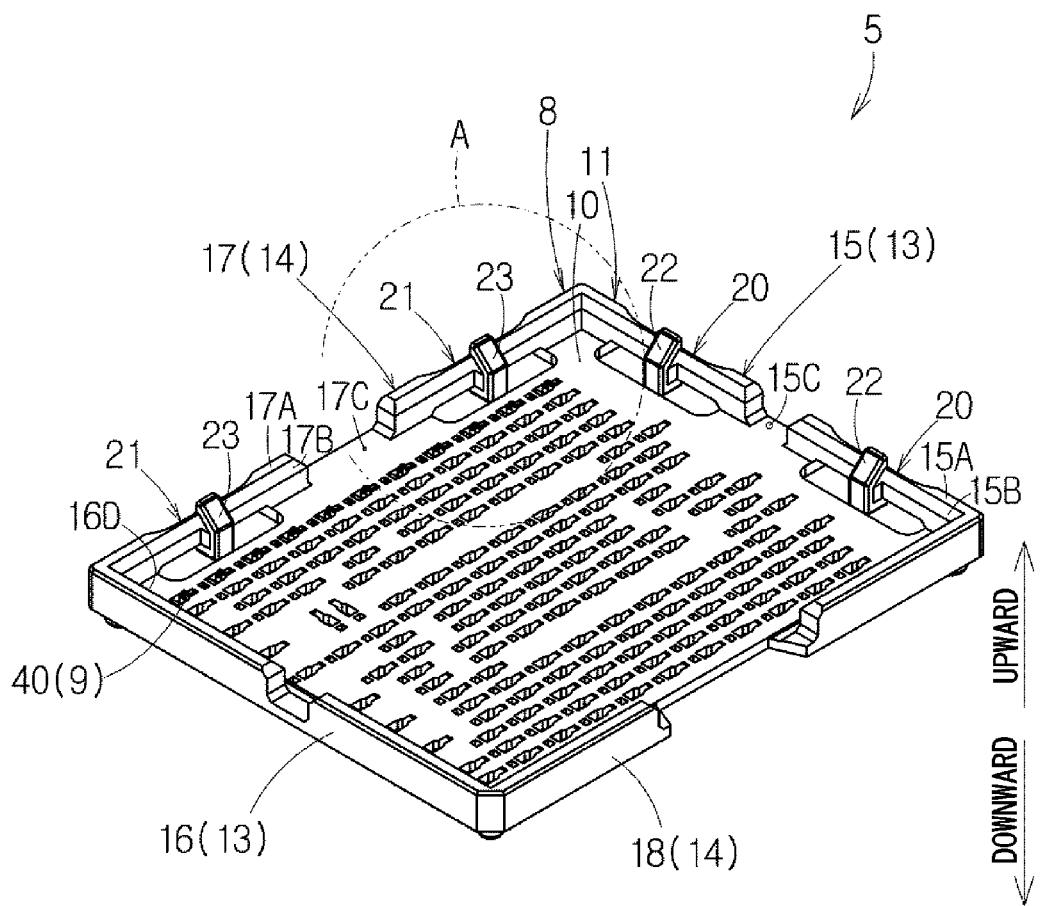
FIG. 5 is a perspective view of the connector main body viewed from another angle (first embodiment)

FIGS. 4 and 5 are perspective views of the connector main body 5. As shown in FIGS. 4 and 5, the connector main body 5 includes a housing 8 and a plurality of contacts 9 that are held by the housing 8. Note that, in FIGS. 4 and 5, the illustration of some of the plurality of contacts 9 is omitted.

As shown in FIG. 4, the housing 8 is made of insulating resin. The housing 8 includes a bottom plate 10 and a peripheral wall 11 that surrounds the bottom plate 10.

The bottom plate 10 is a rectangular flat plate when viewed from above, and it includes an upper surface 10A and a lower surface 10B. A plurality of contact accommodation parts 12 are formed on the bottom plate 10. The plurality of contact accommodation parts 12 accommodate the plurality of contacts 9, respectively.

The peripheral wall 11 projects upward from the edge of the bottom plate 10. The peripheral wall 11 includes two transverse side walls 13 and two longitudinal side walls 14.

The two transverse side walls 13 are parts of the peripheral wall 11 that extend along the transverse direction. The two transverse side walls 13 include a movable-side transverse side wall 15 (first side wall) and a fixed-side transverse side wall 16 (second side wall). The movable-side transverse side wall 15 and the fixed-side transverse side wall 16 are opposed to each other in the longitudinal direction with the bottom plate 10 interposed therebetween.

The two longitudinal side walls 14 are parts of the peripheral wall 11 that extend along the longitudinal direction. The two longitudinal side walls 14 include a movable-side longitudinal side wall 17 (first side wall) and a fixed-side longitudinal side wall 18 (second side wall). The movable-side longitudinal side wall 17 and the fixed-side longitudinal side wall 18 are opposed to each other in the transverse direction with the bottom plate 10 interposed therebetween.

Thus, the fixed-side transverse side wall 16 and the fixed-side longitudinal side wall 18 are continuously connected to form an L-shape when viewed from above. Likewise, the movable-side transverse side wall 15 and the movable-side longitudinal side wall 17 are continuously connected to form an L-shape when viewed from above.

The fixed-side transverse side wall 16 is a flat plate whose thickness direction is parallel to the longitudinal direction. An inward edge in the longitudinal direction of an upper surface 16A of the fixed-side transverse side wall 16 has an inclined surface 16B that is inclined downward as it goes inward in the longitudinal direction. A notch 16C is made at the center in the transverse direction of the fixed-side transverse side wall 16. The notch 16C may be omitted. The fixed-side transverse side wall 16 includes an inner side surface 16D that faces inward in the longitudinal direction.

The fixed-side longitudinal side wall 18 is a flat plate whose thickness direction is parallel to the transverse direction. An inward edge in the transverse direction of an upper surface 18A of the fixed-side longitudinal side wall 18 has an inclined surface 18B that is inclined downward as it goes inward in the transverse direction. A notch 18C is made at the center in the longitudinal direction of the fixed-side longitudinal side wall 18. The notch 18C may be omitted. The fixed-side longitudinal side wall 18 includes an inner side surface 18D that faces inward in the transverse direction.

Referring next to FIG. 5, the movable-side transverse side wall 15 is a flat plate whose thickness direction is parallel to the longitudinal direction. An inward edge in the longitudinal direction of an upper surface 15A of the movable-side transverse side wall 15 has an inclined surface 15B that is inclined downward as it goes inward in the longitudinal direction. A notch 15C is made at the center in the transverse direction of the movable-side transverse side wall 15. The inclined surface 15B and the notch 15C may be omitted.

The movable-side longitudinal side wall 17 is a flat plate whose thickness direction is parallel to the transverse direction. An inward edge in the transverse direction of an upper surface 17A of the movable-side longitudinal side wall 17 has an inclined surface 17B that is inclined downward as it goes inward in the transverse direction. A notch 17C is made at the center in the longitudinal direction of the movable-side longitudinal side wall 17. The inclined surface 17B and the notch 17C may be omitted.

The upper surface 16A of the fixed-side transverse side wall 16 and the upper surface 18A of the fixed-side longitudinal side wall 18 shown in FIG. 4 and the upper surface 15A of the movable-side transverse side wall 15 and the upper surface 17A of the movable-side longitudinal side wall 17 shown in FIG. 5 have the same height.

Referring still to FIG. 5, the movable-side transverse side wall 15 includes two elastic pieces 20. The two elastic pieces 20 are disposed separately from each other in the transverse direction. Each of the elastic pieces 20 is a double fixed beam that is elastically deformable in the longitudinal direction. Accordingly, the movable-side transverse side wall 15 is elastically deformable in the longitudinal direction. Each of the elastic pieces 20 is formed by cutting a slit extending in the transverse direction between the bottom plate 10 and the movable-side transverse side wall 15 and making it thin. Each of the elastic pieces 20 is made of insulating resin and molded integrally with the housing 8. Each of the elastic pieces 20 may be a cantilever instead of a double fixed beam.

Likewise, the movable-side longitudinal side wall 17 includes two elastic pieces 21. The two elastic pieces 21 are disposed separately from each other in the longitudinal direction. Each of the elastic pieces 21 is a double fixed beam that is elastically deformable in the transverse direction. Accordingly, the movable-side longitudinal side wall 17 is elastically deformable in the transverse direction. Each of the elastic pieces 21 is formed by cutting a slit extending in the longitudinal direction between the bottom plate 10 and the movable-side longitudinal side wall 17 and making it thin. Each of the elastic pieces 21 is made of insulating resin and molded integrally with the housing 8. Each of the elastic pieces 21 may be a cantilever instead of a double fixed beam.

A block 22 (projecting part) is formed at the center in the transverse direction of each elastic piece 20. Each block 22 is formed to project upward and inward in the longitudinal direction from each elastic piece 20. Each block 22 is made of insulating resin and molded integrally with each elastic piece 20. Alternatively, each block 22 may be made of metal. In this case, each block 22 is attached to the corresponding elastic piece 20 by insert molding or press fitting.

Likewise, a block 23 (projecting part) is formed at the center in the longitudinal direction of each elastic piece 21. Each block 23 is formed to project upward and inward in the transverse direction from each elastic piece 21. Each block 23 is made of insulating resin and molded integrally with each elastic piece 21. Alternatively, each block 23 may be made of metal. In this case, each block 23 is attached to the corresponding elastic piece 21 by insert molding or press fitting.

Each of the blocks 22 and each of the blocks 23 will be described hereinafter with reference to FIGS. 5 to 7. Note that, however, since the two blocks 23 have the same shape, only one of the blocks 23, which is the block 23 closer to the movable-side transverse side wall 15, will be described below, and the description of the other block 23 will be omitted.

Further, while each block 22 projects inward in the longitudinal direction from the corresponding elastic piece 20, each block 23 projects inward in the transverse direction from the corresponding elastic piece 21. Thus, since each block 22 is different from each block 23 only in the direction of projection and has the same shape as each block 23, the description of each block 22 will be omitted.

Figure 6:
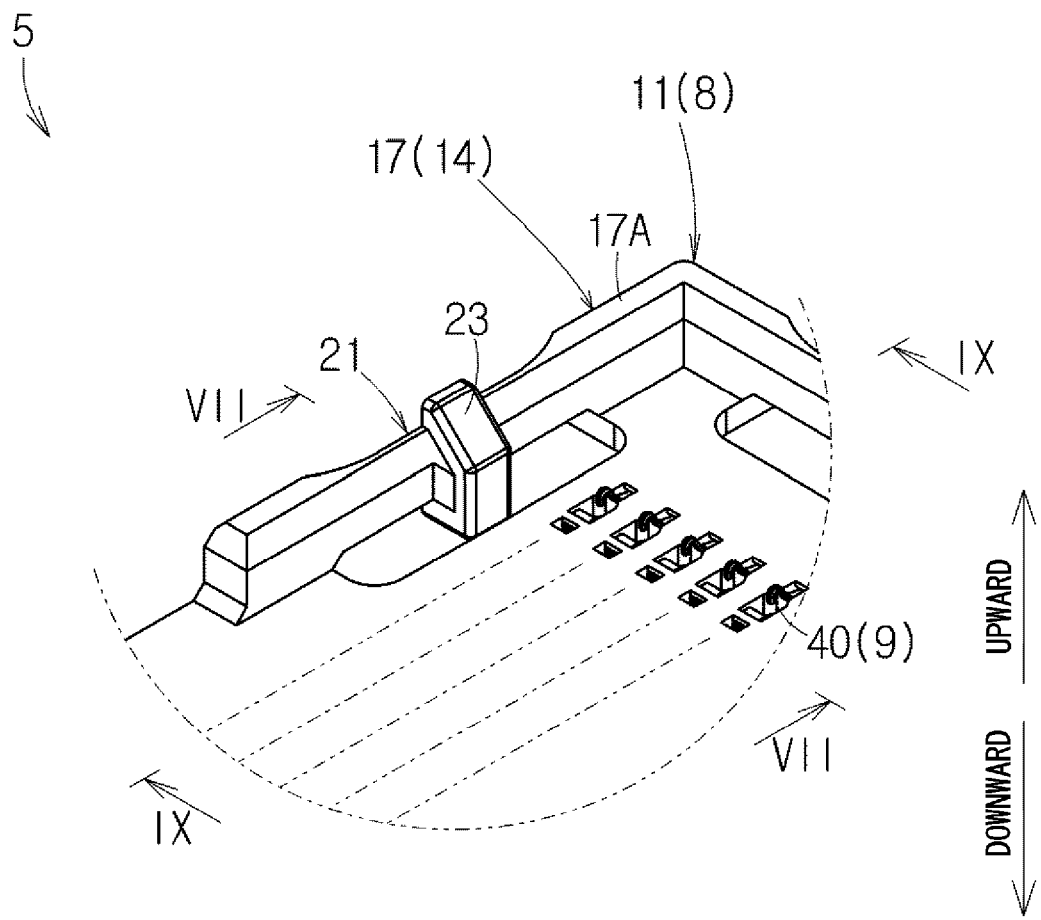
FIG. 6 is an enlarged view of a part A shown in FIG. 5 (first embodiment)

As shown in FIG. 6, the block 23 projects upward beyond the peripheral wall 11. The block 23 projects upward beyond the upper surface of the peripheral wall 11. The block 23 projects upward beyond the movable-side longitudinal side wall 17. The block 23 projects upward beyond the upper surface 17A of the movable-side longitudinal side wall 17. The block 23 projects upward beyond the elastic piece 21.

Figure 7:
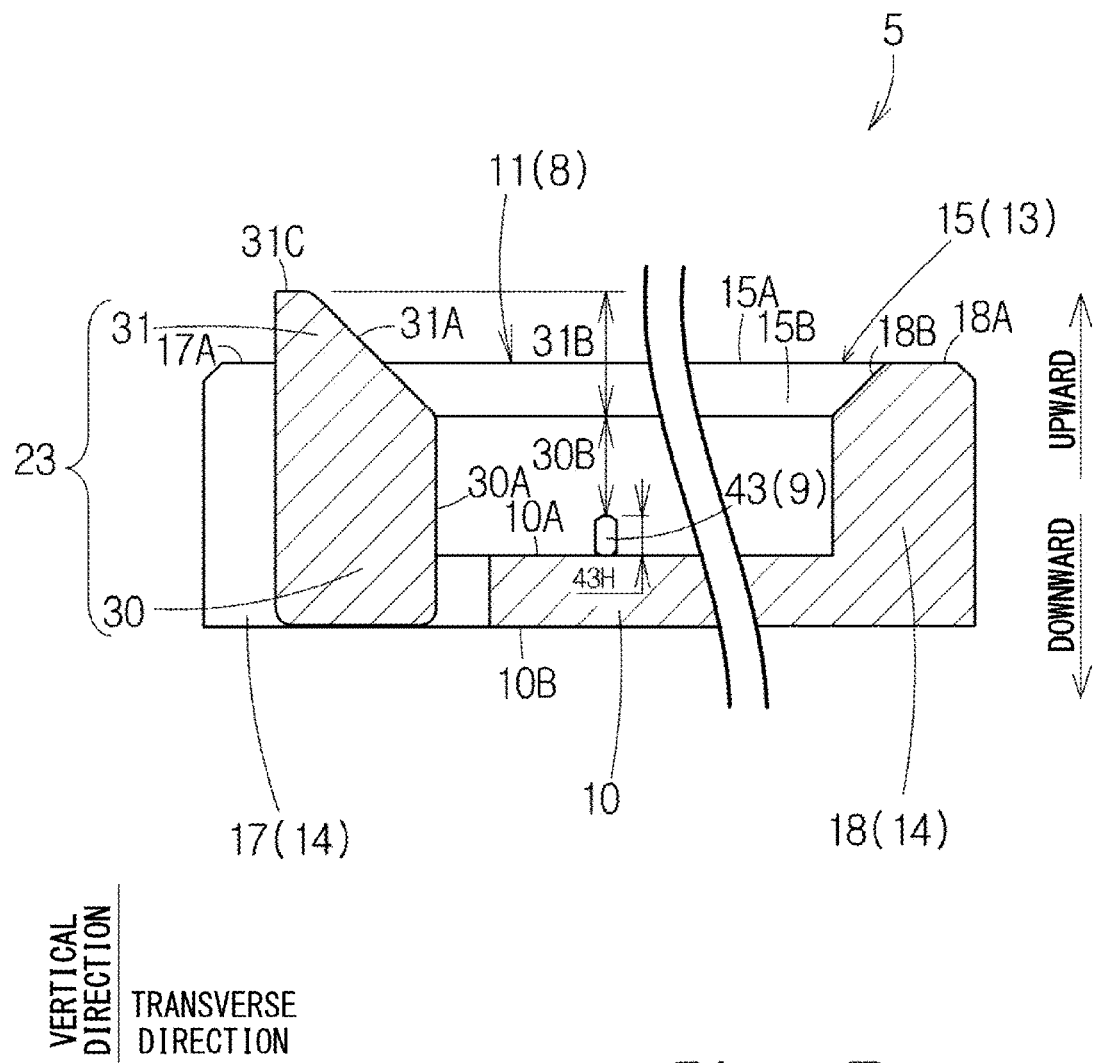
FIG. 7 is a cross-sectional view along arrows VII-VII in FIG. 6 (first embodiment)

As shown in FIG. 7, the block 23 includes a positioning press part 30 and an accommodation guide part 31 that is disposed above the positioning press part 30.

The positioning press part 30 includes a press surface 30A that faces inward in the transverse direction. The press surface 30A is a surface perpendicular to the transverse direction. The press surface 30A is located entirely below the upper surface 17A of the movable-side longitudinal side wall 17.

The accommodation guide part 31 projects upward from the positioning press part 30. The accommodation guide part 31 projects upward beyond the peripheral wall 11. The accommodation guide part 31 projects upward beyond the upper surface of the peripheral wall 11. The accommodation guide part 31 projects upward beyond the movable-side longitudinal side wall 17. The accommodation guide part 31 projects upward beyond the upper surface 17A of the movable-side longitudinal side wall 17. The accommodation guide part 31 projects upward from the positioning press part 30, that is located below the upper surface 17A of the movable-side longitudinal side wall 17, and projects upward beyond the upper surface 17A of the movable-side longitudinal side wall 17. The accommodation guide part 31 includes an inclined guide surface 31A that is inclined downward as it goes inward in the transverse direction. The lower end of the inclined guide surface 31A and the lower end of the inclined surface 18B are at the same positions in the vertical direction. The distance from the lower end to the upper end of the inclined guide surface 31A in the vertical direction is defined as a distance 31B. The accommodation guide part 31 has an upper end 31C. The inclined guide surface 31A extends obliquely from a position below the upper surface 17A of the movable-side longitudinal side wall 17 to a position above the upper surface 17A of the movable-side longitudinal side wall 17.

Referring back to FIG. 4, the plurality of contacts 9 are made of metal, and formed by punching and bending a metal plate plated with copper or copper alloy, for example. The plurality of contacts 9 include a plurality of longitudinal contacts 40 and a plurality of transverse contacts 41.

Each of the longitudinal contacts 40 and each of the transverse contacts 41 have the same shape. Each of the longitudinal contacts 40 and each of the transverse contacts 41 have a different orientation when viewed from above. Specifically, each longitudinal contact 40 is disposed to extend in the longitudinal direction. Each transverse contact 41 is disposed to extend in the transverse direction. Only two of the plurality of contacts 9 are the transverse contacts 41, and the other contacts 9 are the longitudinal contacts 40.

Figure 8:
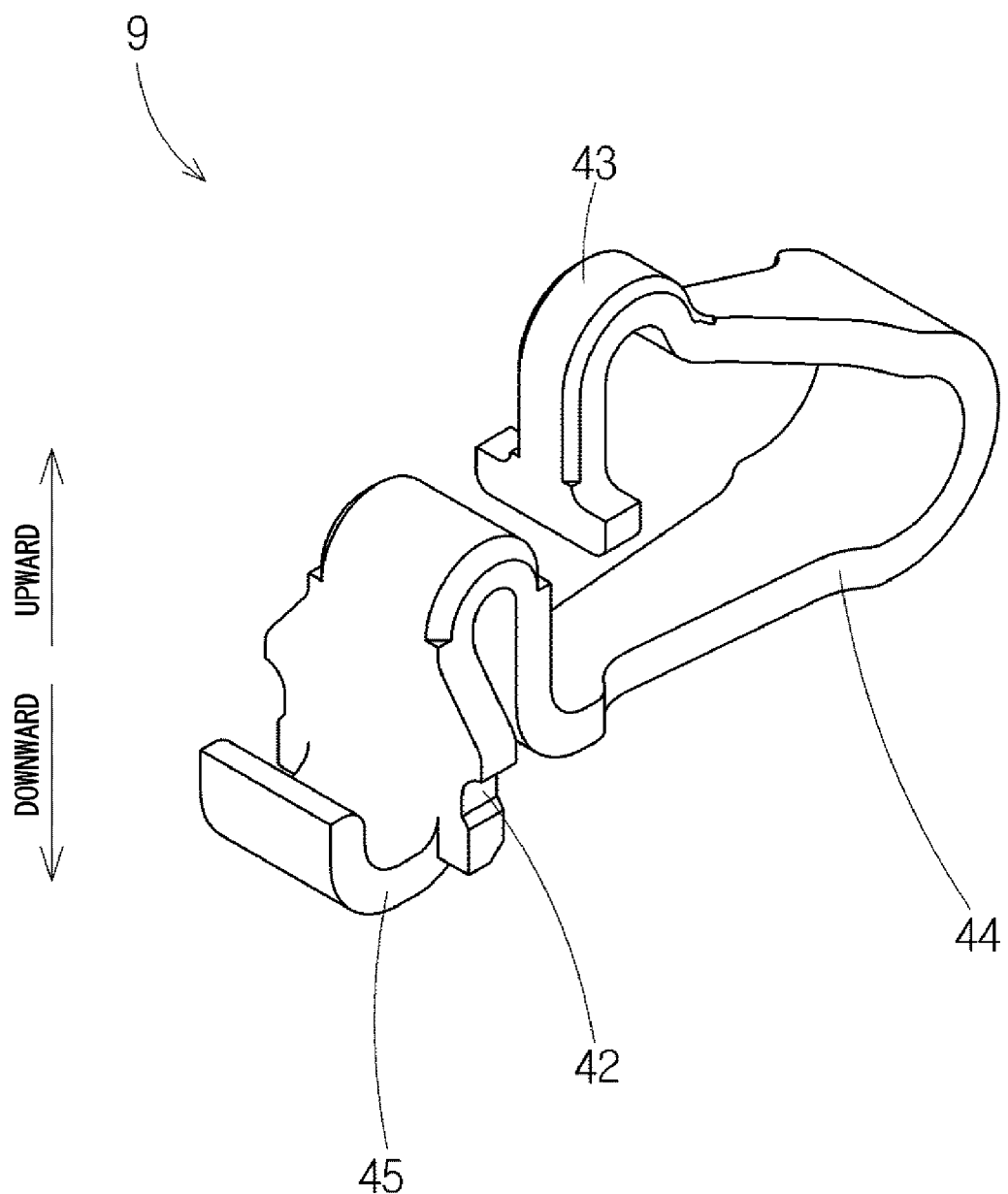
FIG. 8 is a perspective view of a contact (first embodiment)
Figure 9:
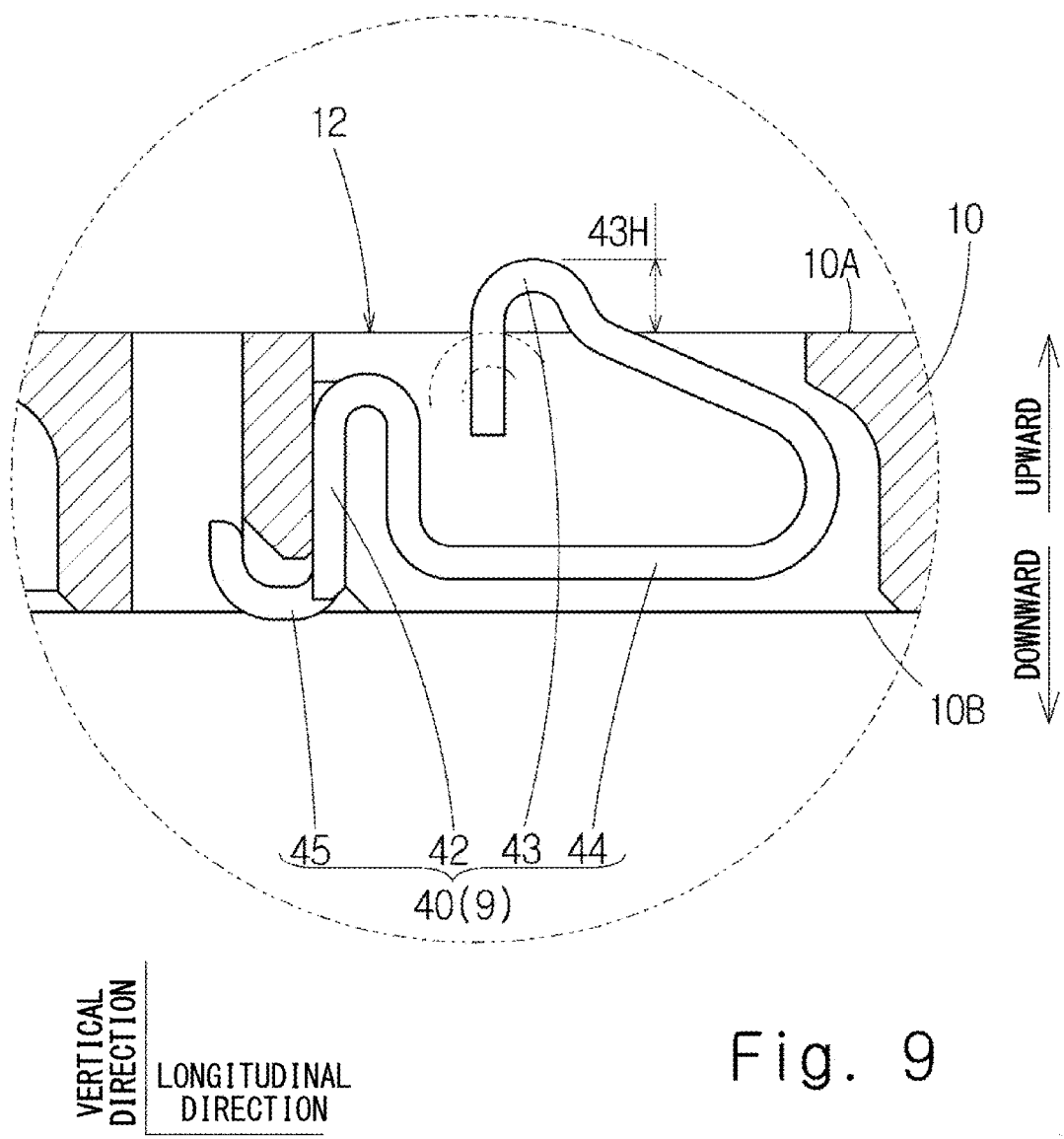
FIG. 9 is a cross-sectional view along arrows IX-IX in FIG. 6 (first embodiment)

FIG. 8 is a perspective view of each of the contacts 9. FIG. 9 is a cross-sectional view along arrows IX-IX in FIG. 6.

As shown in FIGS. 8 and 9, each contact 9 includes a contact fixing part 42 that is to be fixed to the bottom plate 10, a contact contacting part 43 that projects upward beyond the upper surface 10A of the bottom plate 10 and thereby comes into contact with the semiconductor package 2, a contact connection part 44 that is elastically deformable and connects the contact fixing part 42 and the contact contacting part 43 in such a way that the contact contacting part 43 is displaceable in the vertical direction, and a solder part 45 that is to be soldered to the board 4. The solder part 45, the contact fixing part 42, the contact connection part 44, and the contact contacting part 43 are continuously connected in this recited order.

FIG. 9 shows the state where the contact 9 is accommodated in the corresponding contact accommodation part 12 of the bottom plate 10. As shown in FIG. 9, the contact fixing part 42 is press-fit to an inner surface of the corresponding contact accommodation part 12 and thereby fixed to the bottom plate 10.

The contact contacting part 43 has a U-shape that opens downward, and projects upward beyond the upper surface 10A of the bottom plate 10 when no load is imposed on the contact connection part 44. An upward projecting height of the contact contacting part 43 from the upper surface 10A of the bottom plate 10 when no load is imposed on the contact connection part 44 is defined as a projecting height 43H.

The contact connection part 44 has a U-shape that opens in the longitudinal direction or in the transverse direction when viewed from a side.

The contact connection part 44 of each longitudinal contact 40 has a U-shape that opens in the longitudinal direction when viewed from a side. To be specific, the contact connection part 44 of each longitudinal contact 40 has a U-shape that opens toward the fixed-side transverse side wall 16 shown in FIG. 5. Thus, as indicated by the chain double-dashed line in FIG. 9, the contact contacting part 43 of each longitudinal contact 40 approaches the fixed-side transverse side wall 16 as it is displaced downward.

On the other hand, the contact connection part 44 of each transverse contact 41 has a U-shape that opens in the transverse direction when viewed from a side. To be specific, the contact connection part 44 of each transverse contact 41 has a U-shape that opens toward the fixed-side longitudinal side wall 18 shown in FIG. 4. Thus, the contact contacting part 43 of each transverse contact 41 approaches the fixed-side longitudinal side wall 18 as it is displaced downward.

Referring back to FIG. 7, the distance in the vertical direction from the upper end of the contact contacting part 43 to the upper end of the press surface 30A is defined as a distance 30B.

The distance 30B is an important dimension to sandwich the semiconductor package 2 between the positioning press part 30 and the fixed-side longitudinal side wall 18 in the transverse direction and thereby positioning and provisionally holding the semiconductor package 2. If the distance 30B is too short, the semiconductor package 2 is not reliably sandwiched between the positioning press part 30 and the fixed-side longitudinal side wall 18, which causes a failure to reliably exert the positioning function and the provisional holding function described above. Therefore, the distance 30B is preferably long.

The distance 31B is an important dimension to bring the semiconductor package 2 into the inside of the peripheral wall 11. If the distance 31B is too short, the guiding effect by the accommodation guide part 31 is degraded, which decreases the workability of sandwiching the semiconductor package 2 between the positioning press part 30 and the fixed-side longitudinal side wall 18. Therefore, the distance 31B is preferably long.

The projecting height 43H is an important dimension to exert the wiping effect between the contact contacting part 43 and the land 2C of the semiconductor package 2. If the projecting height 43H is too small, the wiping effect decreases, which degrades the contact stability between the lands 2C of the semiconductor package 2 and the contacts 9. In addition, if the projecting height 43H is too small, the variation of the contact force of the contact contacting part 43 against the land 2C, which corresponds to the dimensional variation of the contact 9 as a component, increases, which also degrades the contact stability. Therefore, the projecting height 43H is basically preferably large.

The upper cover member 6 and the lower cover member 7 will be described hereinafter with reference to FIGS. 2 and 3.

The upper cover member 6 is disposed above the semiconductor package 2 that is accommodated in the housing 8, and holds the semiconductor package 2 downward and thereby causes the semiconductor package 2 to come into electrical contact with the plurality of contacts 9. The upper cover member 6 is one specific example of the cover member.

The lower cover member 7 is disposed below the board 4, and is coupled to the upper cover member 6 by bolt fastening.

Thus, in this embodiment, by coupling the upper cover member 6 and the lower cover member 7 to each other with the semiconductor package 2, the connector main body 5 and the board 4 interposed between the upper cover member 6 and the lower cover member 7, the upper cover member 6 holds the semiconductor package 2 downward. Alternatively, when the board 4 has sufficient stiffness, the lower cover member 7 may be omitted, and the upper cover member 6 may be fastened to the board 4.

The upper cover member 6 is made of metal, and formed by punching and bending a stainless steel plate, for example. The upper cover member 6 includes a cover main body 50 and two leg parts 51.

The cover main body 50 includes a package contact part 50A and an opposed-to peripheral wall part 50B.

The package contact part 50A is opposed to the upper surface 2A of the semiconductor package 2 in the vertical direction, and comes into surface contact with the upper surface 2A of the semiconductor package 2 when mating the semiconductor package 2 with the socket connector 3.

The opposed-to peripheral wall part 50B is opposed to the peripheral wall 11 of the housing 8 in the vertical direction, and annularly surrounds the package contact part 50A.

The package contact part 50A is recessed downward beyond the opposed-to peripheral wall part 50B.

Further, the opposed-to peripheral wall part 50B has, at positions opposed to the four accommodation guide parts 31 in the vertical direction, relief holes 50C (holes) into which each accommodation guide part 31 can be inserted. Each of the relief holes 50C is made to penetrate the opposed-to peripheral wall part 50B in the vertical direction.

Each of the two leg parts 51 projects outward in the transverse direction from the cover main body 50. A bolt fastening hole 51A is made at the center of each leg part 51 in the longitudinal direction. The bolt fastening hole 51A has an inner edge 51B (fixed-to board part). Each bolt fastening hole 51A corresponds to each transverse penetrating hole 4E of the board 4.

The lower cover member 7 is made of metal, and formed by punching and bending a stainless steel plate, for example.

The lower cover member 7 has four bolt fastening holes 7A. The four bolt fastening holes 7A correspond to the two longitudinal penetrating holes 4D and the two transverse penetrating holes 4E of the board 4, respectively.

Use of the socket connector 3 will be described hereinbelow.

(Mounting Step)

First, to mount the connector main body 5 on the upper surface 4A of the board 4, an adequate amount of cream solder is applied to the plurality of lands 4C of the board 4 shown in FIG. 2, and then the connector main body 5 is mounted onto the upper surface 4A of the board 4 by reflow.

(Mating Step)

Figure 10:
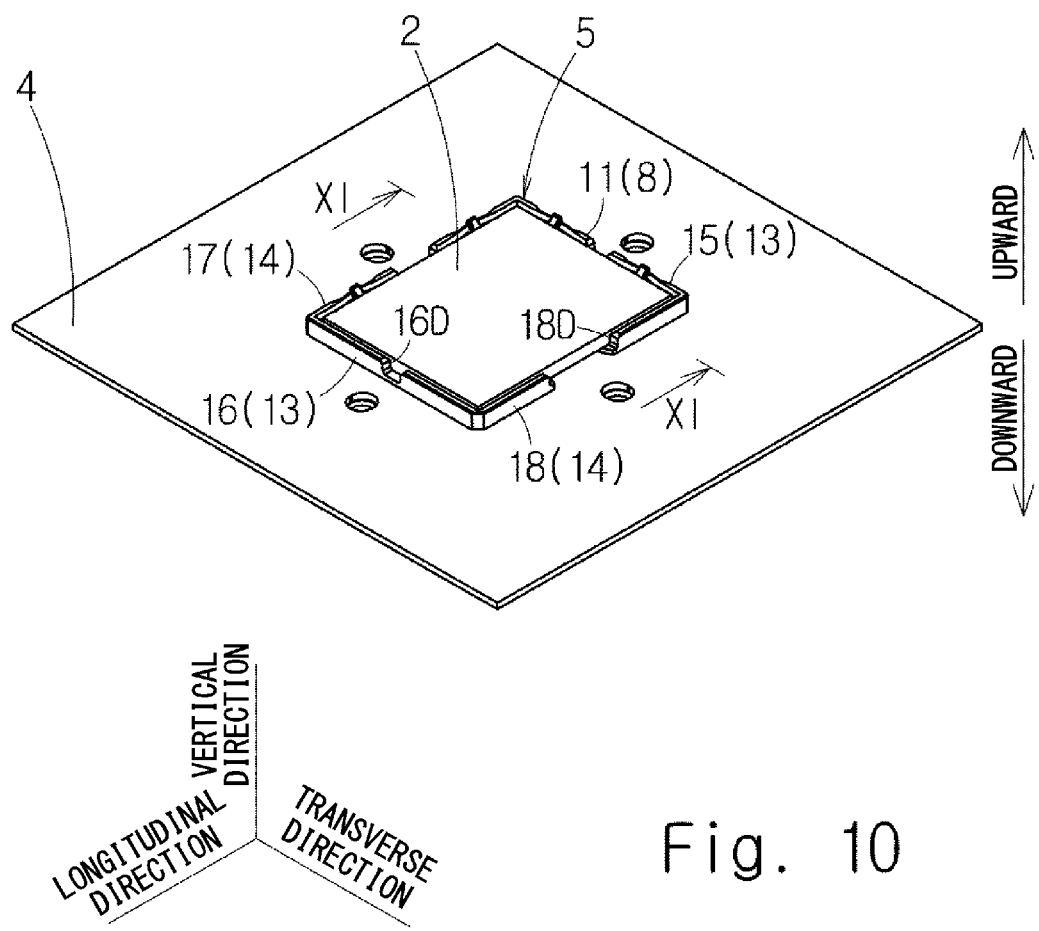
FIG. 10 is a perspective view of the connector main body that accommodates a semiconductor package (first embodiment)
Figure 11:
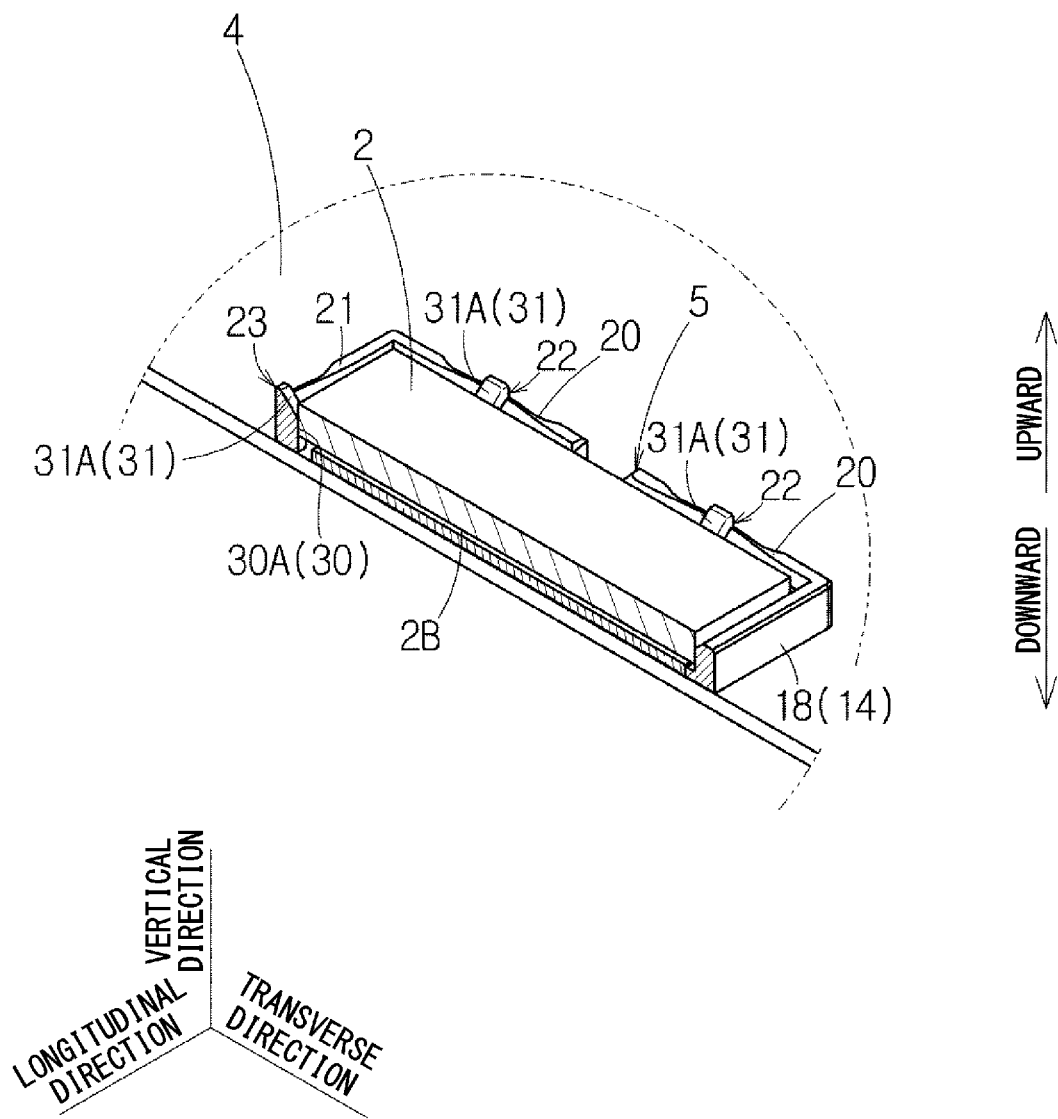
FIG. 11 is a cross-sectional perspective view along arrows XI-XI in FIG. 10 (first embodiment)

Next, to mate the semiconductor package 2 with the connector main body 5, the semiconductor package 2 is accommodated inside the peripheral wall 11 of the connector main body 5 as shown in FIG. 10. To be specific, the semiconductor package 2 is pressed down in the state where the semiconductor package 2 is pressed against the inner side surface 16D of the fixed-side transverse side wall 16 and the inner side surface 18D of the fixed-side longitudinal side wall 18. Correspondingly, the edge of the lower surface 2B of the semiconductor package 2 shown in FIG. 11 is in contact with the inclined guide surface 31A of the accommodation guide part 31 of each block 22 and slides downward on the inclined guide surface 31A, and thereby displaces each block 22 outward in the longitudinal direction. At the same time, the edge of the lower surface 2B of the semiconductor package 2 is in contact with the inclined guide surface 31A of the accommodation guide part 31 of each block 23 and slides downward on the inclined guide surface 31A, and thereby displaces each block 23 outward in the transverse direction. As a result, the semiconductor package 2 transitions from the state of being in contact with the inclined guide surface 31A of the accommodation guide part 31 of each block 22 to the state of being in contact with the press surface 30A of the positioning press part 30 of each block 22. Likewise, the semiconductor package 2 transitions from the state of being in contact with the inclined guide surface 31A of the accommodation guide part 31 of each block 23 to the state of being in contact with the press surface 30A of the positioning press part 30 of each block 23.

Figure 12:
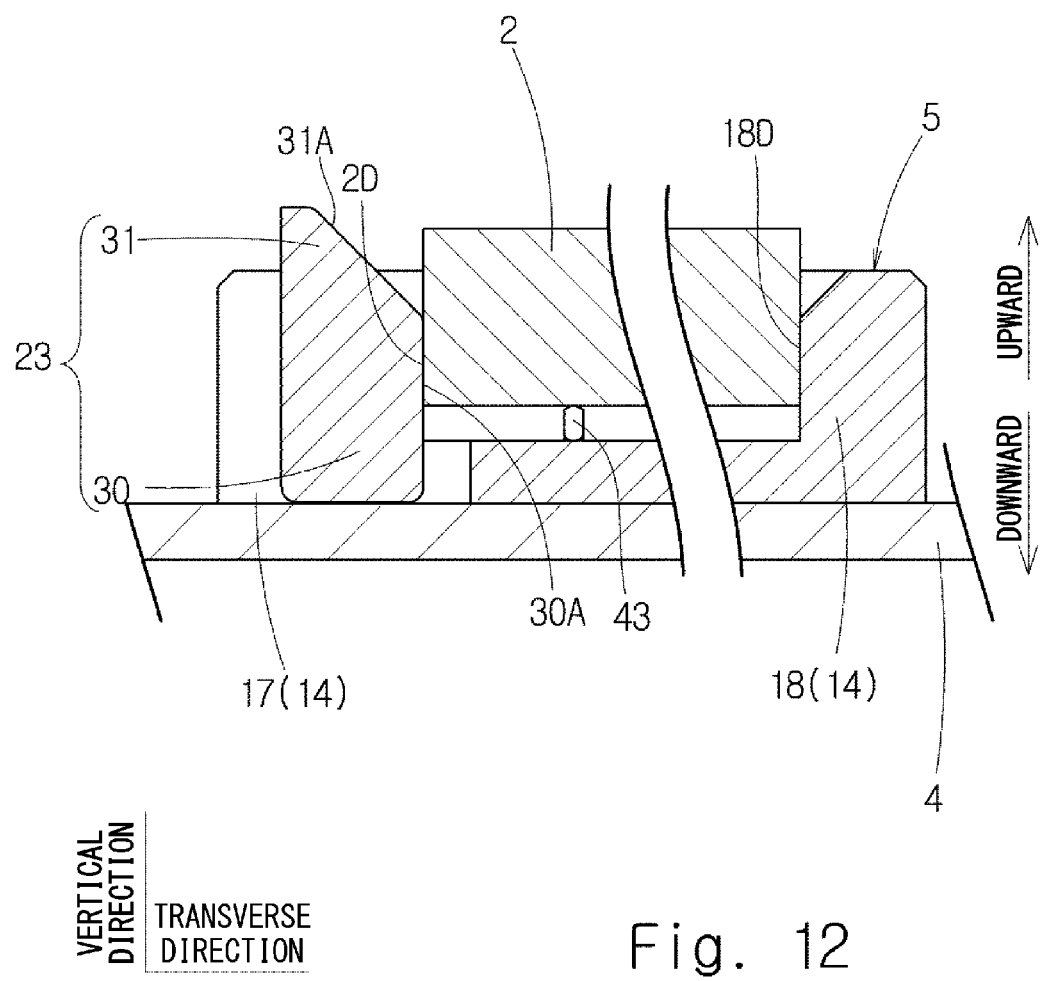
FIG. 12 is a cross-sectional view along arrows XI-XI in FIG. 10 (first embodiment)

At this time, as shown in FIG. 12, in the transverse direction, the press surface 30A of the positioning press part 30 of each block 23 comes into surface contact with a side surface 2D of the semiconductor package 2, and presses the semiconductor package 2 inward in the transverse direction, i.e., toward the fixed-side longitudinal side wall 18, by the elastic restoring force of each elastic piece 21 of the movable-side longitudinal side wall 17. This pressing force is received by the inner side surface 18D of the fixed-side longitudinal side wall 18 through the semiconductor package 2. As a result, the semiconductor package 2 is sandwiched between the press surface 30A of the positioning press part 30 of each block 23 and the inner side surface 18D of the fixed-side longitudinal side wall 18 in the transverse direction to be provisionally held, and is positioned with respect to the connector main body 5 in the transverse direction.

Likewise, as shown in FIG. 5, in the longitudinal direction, the press surface 30A of the positioning press part 30 of each block 22 comes into surface contact with the side surface 2D of the semiconductor package 2, and presses the semiconductor package 2 inward in the longitudinal direction, i.e., toward the fixed-side transverse side wall 16, by the elastic restoring force of each elastic piece 20 of the movable-side transverse side wall 15. This pressing force is received by the inner side surface 16D of the fixed-side transverse side wall 16 through the semiconductor package 2. As a result, the semiconductor package 2 is sandwiched between the press surface 30A of the positioning press part 30 of each block 22 and the inner side surface 16D of the fixed-side transverse side wall 16 in the longitudinal direction to be provisionally held, and is positioned with respect to the connector main body 5 in the longitudinal direction.

In the above-described state of being provisionally held, the semiconductor package 2 butts against the contact contacting parts 43 of the plurality of contacts 9 in the vertical direction as shown in FIG. 12, and the contact connection parts 44 of the plurality of contacts 9 are not yet elastically deformed.

Figure 13:
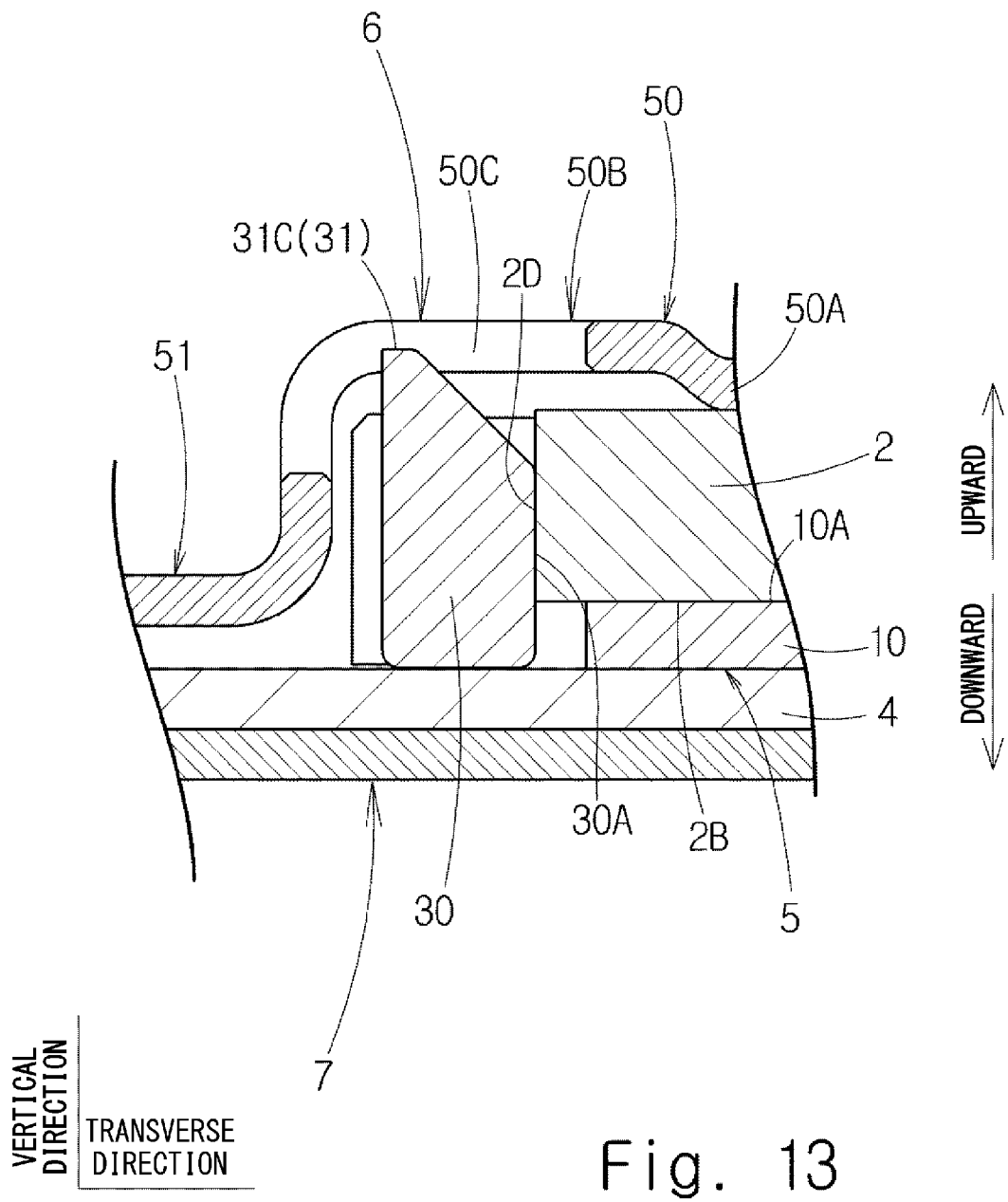
FIG. 13 is a cross-sectional view showing the state where the semiconductor package is held down by a cover member (first embodiment)

Next, referring to FIGS. 1 to 3, the upper cover member 6 is disposed above the semiconductor package 2, and the lower cover member 7 is disposed below the board 4. Then, the upper cover member 6 and the lower cover member 7 are coupled to each other by bolt fastening. The two leg parts 51 thereby come closer to the board 4, and the package contact part 50A of the cover main body 50 of the upper cover member 6 holds the semiconductor package 2 downward as shown in FIGS. 12 and 13. The lower surface 2B of the semiconductor package 2 thereby reaches the upper surface 10A of the bottom plate 10 as shown in FIG. 13, and the contact contacting part 43 of each contact 9 shown in FIG. 9 is displaced downward by the length of the projecting height 43H as indicated by the chain double-dashed line. At this time, since the contact contacting part 43 is displaced also in the longitudinal direction or in the transverse direction as described above, each land 2C formed on the lower surface 2B of the semiconductor package 2 and the contact contacting part 43 of each contact 9 rub against each other, and so-called wiping effect is thereby exerted. The frictional force generated between each contact 9 and the semiconductor package 2 acts in the direction toward the fixed-side transverse side wall 16 or the fixed-side longitudinal side wall 18. Therefore, the semiconductor package 2 does not move in the longitudinal direction or in the transverse direction due to this frictional force, and the wiping effect is thereby fully exerted.

As shown in FIG. 13, each accommodation guide part 31 is inserted into the corresponding relief hole 50C. To be specific, the upper end 31C of each accommodation guide part 31 is placed in the internal space of the corresponding relief hole 50C. If the relief hole 50C is not made, the opposed-to peripheral wall part 50B needs to be sufficiently separated from the board 4 in the state where the semiconductor package 2 is mated with the connector main body 5 in order to prevent the upper end 31C of each accommodation guide part 31 from physically interfering with the opposed-to peripheral wall part 50B. Therefore, by making the relief hole 50C in the opposed-to peripheral wall part 50B, the upper end 31C of each accommodation guide part 31 does not physically interfere with the opposed-to peripheral wall part 50B even when the opposed-to peripheral wall part 50B is close to the board 4, and thereby the height reduction of the socket connector 3 is achieved. In practice, the height of the socket connector 3 is reduced by the thickness of the upper cover member 6.

Another possible technique to reduce the height of the socket connector 3 is as follows. Since the height reduction of the socket connector 3 is inhibited by the block 23 that projects upward beyond the peripheral wall 11, the reduction of the height of the socket connector 3 would be easily achieved by reducing the height of the block 23. To be specific, the upper end 31C of the accommodation guide part 31 could be placed lower than the upper surface 17A of the movable-side longitudinal side wall 17 by reducing any one or a plurality of the projecting height 43H, the distance 30B and the distance 31B shown in FIG. 7. However, since all of the projecting height 43H, the distance 30B and the distance 31B have specific technical significance as described earlier, it is difficult to reduce those dimensions only for the purpose of reducing the height. Thus, by making the above-described relief holes 50C in the opposed-to peripheral wall part 50B as shown in FIG. 13, the height reduction of the socket connector 3 and the technical significance related to each of the projecting height 43H, the distance 30B and the distance 31B are achieved simultaneously.

Figure 14:
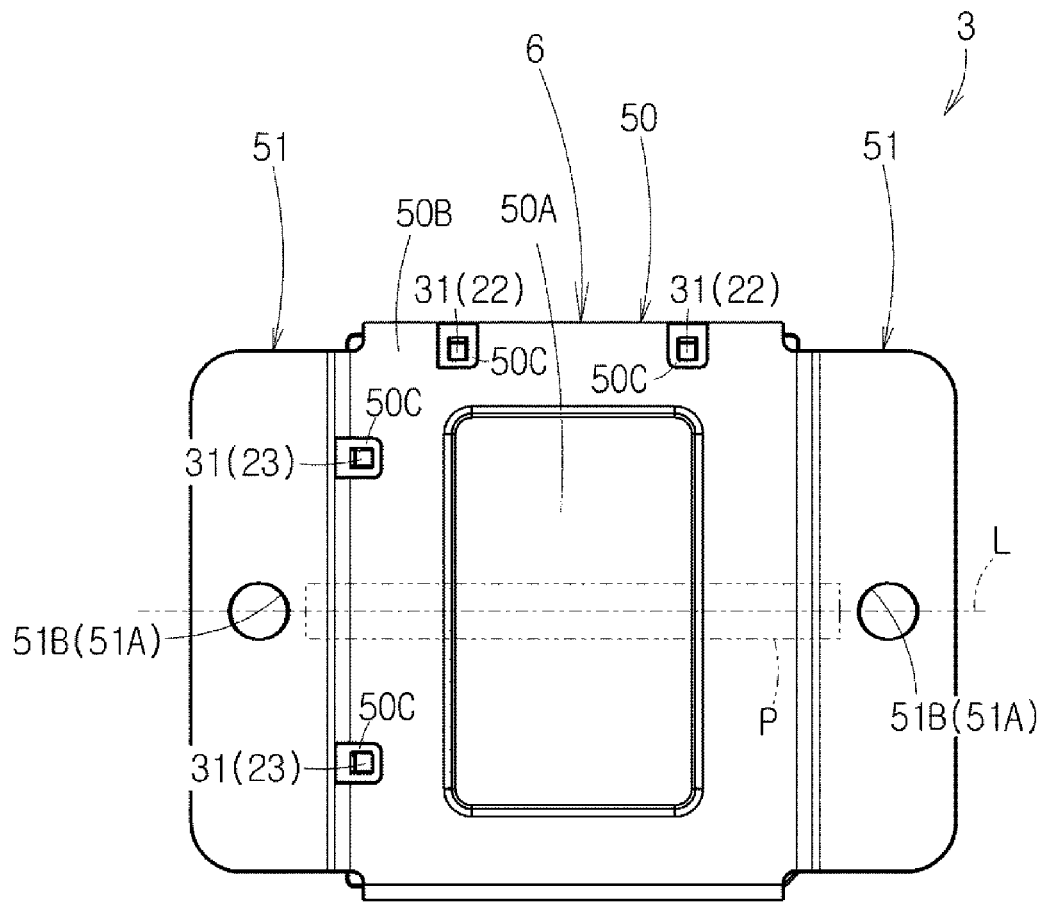
FIG. 14 is a plan view of a socket connector (first embodiment)

FIG. 14 is a plan view of the socket connector 3. As shown in FIG. 14, all of the four relief holes 50C in the opposed-to peripheral wall part 50B of the cover main body 50 of the upper cover member 6 are made at positions that do not overlap a line L connecting the center points of the inner edges 51B of the two bolt fastening holes 51A respectively made in the two leg parts 51 of the upper cover member 6. In other words, all of the two blocks 22 and the two blocks 23 are formed at positions that do not overlap the line L. In this structure, the following effects are obtained.

Specifically, if the semiconductor package 2 is held downward by using the upper cover member 6, the upper cover member 6 is deformed to be curved upward in such a way that the package contact part 50A projects upward. In order to reliably hold the semiconductor package 2 downward by the upper cover member 6, it is necessary to ensure the stiffness of a part P along the line L so as to suppress the above-described curved deformation. In view of this, all of the four relief holes 50C are made at positions that do not overlap the line L, so that the stiffness of the part P is not degraded, which allows the semiconductor package 2 to be reliably held downward by using the upper cover member 6 without increasing the thickness of the upper cover member 6.

The first embodiment is described above. The above-described embodiment has the following features.

As shown in FIGS. 1 to 14, the socket connector 3 includes the housing 8 that is made of insulating resin having the peripheral wall 11 and the bottom plate 10, the peripheral wall 11 projecting upward from the edge of the bottom plate 10, the plurality of contacts 9 that are held by the bottom plate 10, the upper cover member 6 (cover member) that is disposed above the semiconductor package 2 (an object to be connected) accommodated in the housing 8 and holds the semiconductor package 2 downward and thereby brings the semiconductor package 2 into electrical contact with the plurality of contacts 9, and the block 22 and the block 23 (projecting parts) that project upward beyond the peripheral wall 11. In the upper cover member 6, the relief holes 50C (holes) in which the block 22 and the block 23 are to be inserted are formed at positions opposed to the block 22 and the block 23 in the vertical direction. In this structure, the height of the socket connector 3 of a type that holds down the semiconductor package 2 by the upper cover member 6 is reduced even when the block 22 and the block 23 project upward beyond the peripheral wall 11.

Note that, as shown in FIG. 13, the upper cover member 6 has the relief holes 50C in which the block 22 and the block 23 are to be inserted in the above-described embodiment. Alternatively, the upper cover member 6 may have notches in which the block 22 and the block 23 are to be inserted. Further, the block 22 and the block 23 are not necessarily inserted into the corresponding relief holes 50C in the state where the semiconductor package 2 is held downward. In this case also, clearance in the vertical direction between the block 22 and the block 23 and the upper cover member 6 can be set to be practically uncontrollably small, and therefore the height reduction of the socket connector 3 is achieved in the same manner.

Further, as shown in FIG. 12, the inclined guide surface 31A that guides the semiconductor package 2 when the semiconductor package 2 is accommodated into the housing 8 is formed in the block 22 and the block 23. In this structure, workability when the semiconductor package 2 is accommodated into the housing 8 is high.

Further, as shown in FIG. 5, the housing 8 has a rectangular shape when viewed from above. The peripheral wall 11 includes the movable-side longitudinal side wall 17 (first side wall) and the fixed-side longitudinal side wall 18 (second side wall) that are opposed to each other with the bottom plate 10 interposed therebetween. The movable-side longitudinal side wall 17 is elastically deformable in the transverse direction (first direction) in which the movable-side longitudinal side wall 17 and the fixed-side longitudinal side wall 18 are opposed to each other. The block 23 is placed on the movable-side longitudinal side wall 17 and thereby made displaceable in the transverse direction. In this structure, the block 23 is displaceable in the transverse direction with a mechanically simple structure.

Further, as shown in FIG. 12, the semiconductor package 2 accommodated in the housing 8 is pressed against the fixed-side longitudinal side wall 18 by the elastic restoring force of the movable-side longitudinal side wall 17, and thereby the semiconductor package 2 is positioned with respect to the housing 8 in the transverse direction. In this structure, the positioning of the semiconductor package 2 with respect to the housing 8 is achieved with a mechanically simple structure.

Further, as shown in FIGS. 8 and 9, each contact 9 includes the contact fixing part 42 that is fixed to the bottom plate 10, the contact contacting part 43 that projects upward beyond the upper surface 10A of the bottom plate 10 and thereby comes into contact with the semiconductor package 2, and the elastically deformable contact connection part 44 that connects the contact fixing part 42 and the contact contacting part 43 in such a way that the contact contacting part 43 is displaceable in the vertical direction. Each of the longitudinal contacts 40 is configured in such a way that the contact contacting part 43 approaches the fixed-side transverse side wall 16 as it is displaced downward. In this structure, since the frictional force received by the semiconductor package 2 from the plurality of contacts 9 when holding the semiconductor package 2 downward acts to press the semiconductor package 2 against the fixed-side transverse side wall 16, this frictional force is received by the fixed-side transverse side wall 16 and does not cause the semiconductor package 2 to move in the longitudinal direction. The same applies to each of the transverse contacts 41.

Further, as shown in FIG. 9, the contact connection part 44 of each of the longitudinal contacts 40 has a U-shape that opens toward the fixed-side transverse side wall 16. In this structure, a mechanically simple structure in which the contact contacting part 43 approaches the fixed-side transverse side wall 16 as it is displaced downward is achieved.

Further, as shown in FIG. 14, the upper cover member 6 has the inner edges 51B (fixed-to board parts) of the two bolt fastening holes 51A that are fixed immovably in the vertical direction to the board 4 on which the socket connector 3 is mounted. All of the relief holes 50C are made at positions that do not overlap the line L connecting the two inner edges 51B when viewed from above. In this structure, the stiffness of the part P along the line L is not degraded by the relief holes 50C. Note that the upper cover member 6 may have three or more bolt fastening hole 51A.

Further, as shown in FIG. 14, the inner edges 51B of the two bolt fastening holes 51A are disposed on both sides of the bottom plate 10 when viewed from above. In this structure, the part P along the line L runs above the semiconductor package 2, which enables the semiconductor package 2 to be firmly held downward.

Second Embodiment

A second embodiment of the present disclosure will be described hereinafter with reference to FIG. 15. Differences of this embodiment from the above-described first embodiment will be mainly described below, and redundant description thereof is omitted.

In the above-described first embodiment, as shown in FIG. 14, the upper cover member 6 includes the cover main body 50 and the two leg parts 51, and the two leg parts 51 are disposed in such a way that the cover main body 50 is interposed therebetween in the transverse direction.

Figure 15:
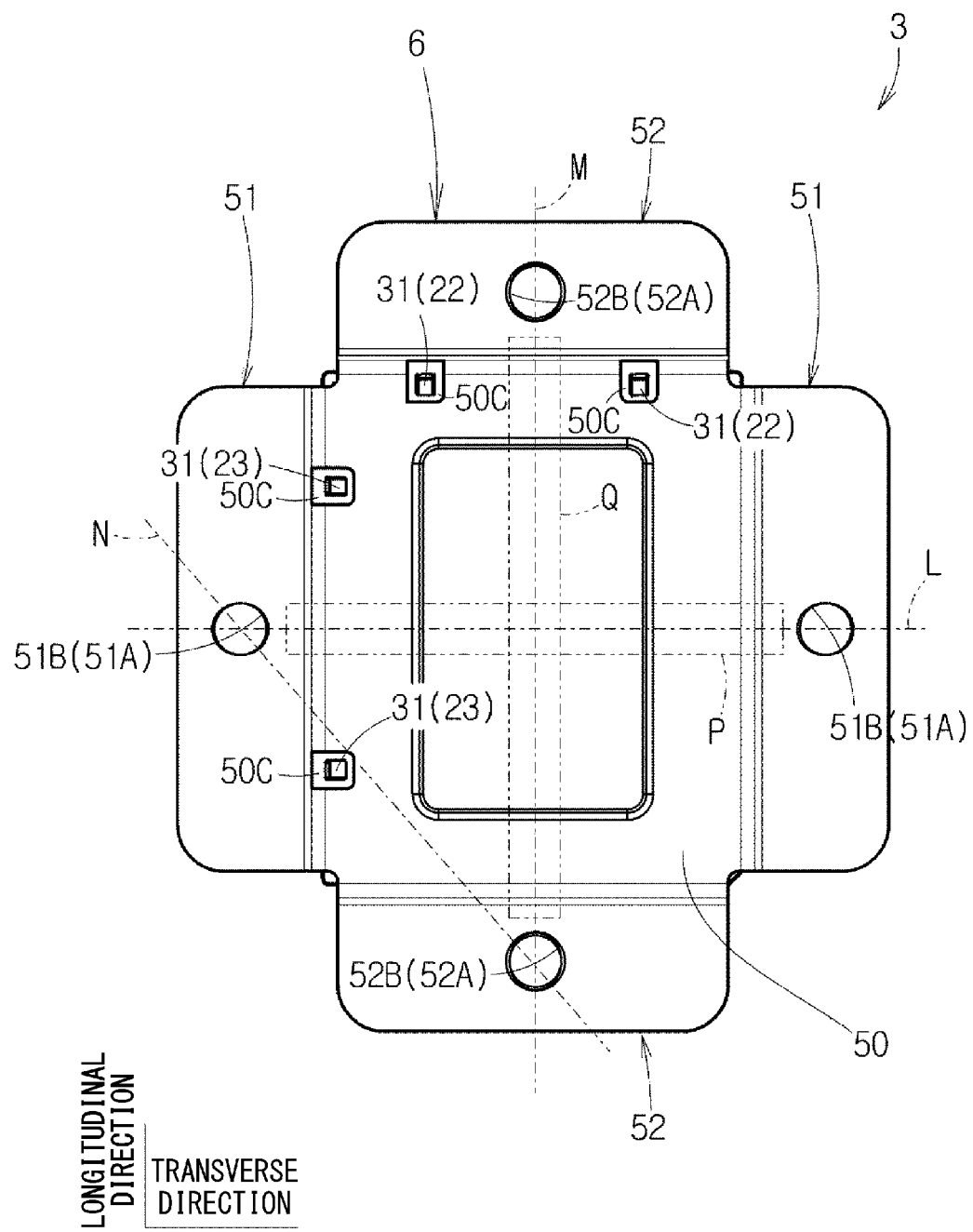
FIG. 15 is a plan view of a socket connector (second embodiment)
Figure 16:
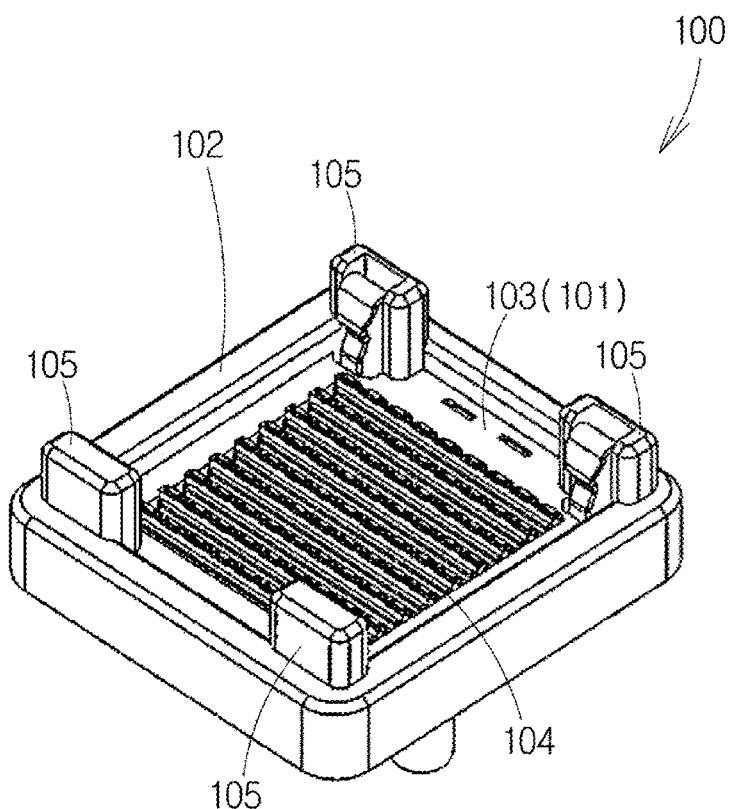
FIG. 16 is a simplified version of FIG. 1A of Patent Literature 1.

Compared to that, in this embodiment, the upper cover member 6 further includes two second leg parts 52 as shown in FIG. 15. The two second leg parts 52 are disposed in such a way that the cover main body 50 is interposed therebetween in the longitudinal direction. The two second leg parts 52 have bolt fastening holes 52A, respectively. Each of the bolt fastening holes 52A has an inner edge 52B (second fixed-to board part). A line M that connects the centers of the inner edges 52B of the two bolt fastening holes 52A when viewed from above is perpendicular to the line L. In this structure, since the upper cover member 6 is fastened to the lower cover member 7 by using the two bolt fastening holes 52A in addition to the two bolt fastening holes 51A, the attitude of the upper cover member 6 around the line L as a rotation axis is stabilized.

Further, as shown in FIG. 15, all of the four relief holes 50C in the opposed-to peripheral wall part 50B of the cover main body 50 of the upper cover member 6 are made at positions that do not overlap any of the line L connecting the centers of the inner edges 51B of the two bolt fastening holes 51A respectively made in the two leg parts 51 of the upper cover member 6 and the line M connecting the centers of the inner edges 52B of the two bolt fastening holes 52A respectively made in the two second leg parts 52. In other words, all of the two blocks 22 and the two blocks 23 are formed at positions that do not overlap any of the line L and the line M. In this structure, the stiffness of the part P along the line L and a part Q along the line M is not degraded, which enables the semiconductor package 2 to be reliably held downward without increasing the thickness of the upper cover member 6.

The second embodiment of the present disclosure is described above. The above-described second embodiment has the following features.

The upper cover member 6 includes two inner edges 51B (first fixed-to board parts) disposed on both sides of the bottom plate 10 when viewed from above, and two inner edges 52B (second fixed-to board parts) disposed on both sides of the bottom plate 10 when viewed from above. The line L (first line) connecting the two inner edges 51B and the line M (second line) connecting the two inner edges 52B are perpendicular to each other. In this structure, the attitude of the upper cover member 6 when the semiconductor package 2 is held downward is stabilized.

Note that, in the case where three or more fixed-to board parts that are fixed immovably in the vertical direction to the board 4 are formed in the upper cover member 6, all of the relief holes 50C are preferably made not to overlap any line connecting two of the three or more fixed-to board parts. For example, as shown in FIG. 15, one relief hole 50C is made to overlap a line N connecting the closest two fixed-to board parts (the inner edge 51B and the inner edge 52B) in the upper cover member 6. Those two fixed-to board parts correspond to adjacent two sides of the bottom plate 10. In this case, it is preferred to form this relief hole 50C avoiding the line N typically by locating it slightly more outward either in the transverse direction or in the longitudinal direction.

The first and second embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

What is claimed is:

1. A socket connector, comprising:
    a housing made of insulating resin having a peripheral wall and a bottom plate which has an upper surface and an edge, the peripheral wall projecting upward from the edge of the bottom plate, the housing being configured to accommodate therein an object to be connected with the socket connector;
    a plurality of contacts held by the bottom plate;
    a cover member configured to be disposed above and hold downward the object in the housing so that the object is brought into an electrical contact with the plurality of contacts, the cover member having a hole or a notch; and
    a projecting part provided on the peripheral wall, the projecting part projecting upward beyond the peripheral wall, wherein the hole or the notch and the projecting part are positioned as opposed to each other in a vertical direction and the projecting part is capable to be inserted in the hole or the notch,
    the housing has a rectangular shape when viewed from above,
    the peripheral wall includes a first side wall and a second side wall opposed to each other with the bottom plate interposed therebetween,
    the first side wall is elastically deformable in a first direction in which the first side wall and the second side wall are opposed to each other.

2. The socket connector according to claim 1, wherein the projecting part has an inclined guide surface to guide the object when the object is fit into the housing.

3. The socket connector according to claim 1, wherein the projecting part is placed on the first side wall and thereby made displaceable in the first direction.

4. The socket connector according to claim 1, wherein the housing is configured to position the object with respect thereto in the first direction by pressing the object in the housing against the second side wall with an elastic restoring force of the first side wall.

5. The socket connector according to claim 1, wherein
each of the plurality of contacts further comprises: a contact fixing part to be fixed to the bottom plate; a contact contacting part projecting upward beyond the upper surface and being capable thereby of coming into contact with the object; and a contact connection part connecting the contact fixing part and the contact contacting part, the contact connection part being elastically deformable such that the contact contacting part is displaceable in the vertical direction, wherein
each of the contacts is configured in such a way that the contact contacting part approaches the second side wall as it is displaced downward.

6. The socket connector according to claim 5, wherein the contact connection part has a U-shape opening toward the second side wall.

7. The socket connector according to claim 1, wherein
the cover member includes at least two fixed-to board parts configured to be fixed immovably in the vertical direction to a board on which the socket connector is mounted, and
the hole or the notch is at a position not overlapping a line connecting the at least two fixed-to board parts when viewed from above.

8. The socket connector according to claim 7, wherein the at least two fixed-to board parts include two fixed-to board parts disposed on both sides of the bottom plate when viewed from above.

9. The socket connector according to claim 7, wherein
the at least two fixed-to board parts include two first fixed-to board parts disposed on both sides of the bottom plate when viewed from above and two second fixed-to board parts disposed on both sides of the bottom plate when viewed from above, and
a first line connecting the two first fixed-to board parts and a second line connecting the two second fixed-to board parts are perpendicular to each other.

10. The socket connector according to claim 1, wherein
the cover member includes at least three fixed-to board parts configured to be fixed immovably in the vertical direction to a board on which the socket connector is mounted, and
the hole or the notch is at a position not overlapping any line connecting two of the at least three fixed-to board parts when viewed from above.

* * * * *